(12) United States Patent
Roitman et al.

(10) Patent No.: US 11,973,167 B2
(45) Date of Patent: Apr. 30, 2024

(54) PHOTORESIST PATTERNING PROCESS SUPPORTING TWO STEP PHOSPHOR-DEPOSITION TO FORM AN LED MATRIX ARRAY

(71) Applicant: LUMILEDS LLC, San Jose, CA (US)

(72) Inventors: Daniel Bernardo Roitman, Menlo Park, CA (US); Emma Dohner, Redwood City, CA (US); Kentaro Shimizu, Sunnyvale, CA (US); Marcel Rene Bohmer, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/548,175

(22) Filed: Dec. 10, 2021

(65) Prior Publication Data

US 2022/0102595 A1    Mar. 31, 2022

Related U.S. Application Data

(63) Continuation of application No. 16/715,930, filed on Dec. 16, 2019, now Pat. No. 11,201,267.
(Continued)

(30) Foreign Application Priority Data

Feb. 11, 2019  (EP) ..................................... 19156331

(51) Int. Cl.
*H01L 33/50* (2010.01)
*H01L 33/00* (2010.01)
*H01L 33/60* (2010.01)

(52) U.S. Cl.
CPC .......... *H01L 33/502* (2013.01); *H01L 33/005* (2013.01); *H01L 33/505* (2013.01); *H01L 33/60* (2013.01); *H01L 2933/0041* (2013.01)

(58) Field of Classification Search
CPC ..................................................... H01L 33/505
(Continued)

(56) References Cited

U.S. PATENT DOCUMENTS

| 5,762,773 A | 6/1998 | Rasmussen |
| 7,284,871 B2 | 10/2007 | Oon et al. |

(Continued)

FOREIGN PATENT DOCUMENTS

| CN | 102077346 A | 5/2011 |
| CN | 102473811 A | 5/2012 |

(Continued)

OTHER PUBLICATIONS

European Search Report corresponding to EP 19156331, dated Jun. 7, 2019, 2 pages.
(Continued)

*Primary Examiner* — Hsin Yi Hsieh

(57) ABSTRACT

A method is described for low temperature curing of silicone structures, including the steps of providing patterning photoresist structures on a substrate. The photoresist structures define at least one open region that can be at least partially filled with a condensation cure silicone system. Vapor phase catalyst deposition is used to accelerate the cure of the condensation cure silicone, and the photoresist structure is removed to leave free standing or layered silicone structures. Phosphor containing silicone structures that are coatable with a reflective metal or other material are enabled by the method.

15 Claims, 7 Drawing Sheets

Related U.S. Application Data

(60) Provisional application No. 62/783,970, filed on Dec. 21, 2018.

(58) Field of Classification Search
USPC .......................................................... 257/98
See application file for complete search history.

(56) References Cited

U.S. PATENT DOCUMENTS

| | | | |
|---|---|---|---|
| 8,097,894 B2 | 1/2012 | Bierhuizen et al. | |
| 8,138,010 B2 | 3/2012 | Scheuerlein et al. | |
| 9,193,833 B2 | 11/2015 | Goto et al. | |
| 9,871,167 B2 | 1/2018 | Moran et al. | |
| 10,388,641 B2* | 8/2019 | Martin | H01L 24/13 |
| 10,431,717 B1 | 10/2019 | Dasgupta et al. | |
| 10,551,728 B1 | 2/2020 | Novotny et al. | |
| 10,930,825 B2 | 2/2021 | Bohmer et al. | |
| 10,985,143 B2 | 4/2021 | Bower et al. | |
| 11,171,267 B2 | 11/2021 | Pourquier et al. | |
| 11,201,267 B2 | 12/2021 | Roitman et al. | |
| 2013/0210179 A1 | 8/2013 | Mei et al. | |
| 2016/0009866 A1 | 1/2016 | Swier | |
| 2016/0268488 A1 | 9/2016 | Goeoetz et al. | |
| 2017/0200765 A1 | 7/2017 | Choi et al. | |
| 2017/0250316 A1 | 8/2017 | Yeon et al. | |
| 2018/0047876 A1 | 2/2018 | Chu et al. | |
| 2019/0027662 A1 | 1/2019 | Saputra et al. | |
| 2019/0074413 A1 | 3/2019 | Streppel | |
| 2019/0123033 A1* | 4/2019 | Martin | H01L 24/16 |
| 2019/0181181 A1 | 6/2019 | Yeon et al. | |
| 2019/0334064 A1 | 10/2019 | Pourquier et al. | |

FOREIGN PATENT DOCUMENTS

| | | |
|---|---|---|
| CN | 105684171 A | 6/2016 |
| CN | 107211504 A | 9/2017 |
| JP | 2007047787 A | 2/2007 |
| JP | 2010090292 A | 4/2010 |
| JP | 2010134303 A | 6/2010 |
| JP | 2014029928 A | 2/2014 |
| JP | 2015028844 A | 2/2015 |
| JP | 2016517463 A | 6/2016 |
| JP | 2016518713 A | 6/2016 |
| JP | 2016218151 A | 12/2016 |
| KR | 20170020485 A | 2/2017 |
| KR | 10-2018-0130356 A | 12/2018 |
| TW | 201139564 A | 11/2011 |
| TW | 201737516 A | 10/2017 |
| TW | 201824607 A | 7/2018 |
| WO | 95/30236 A1 | 11/1995 |
| WO | 2016/014166 A1 | 1/2016 |
| WO | 2017/139387 A1 | 8/2017 |
| WO | 2018/122520 A1 | 7/2018 |
| WO | 2019/218336 A1 | 11/2019 |

OTHER PUBLICATIONS

Extended European Search Report corresponding to EP 19156331.1, dated Jun. 18, 2019, 9 pages.
From the EPO as the International Searching Authority, Notification of the Transmittal of the International Search Report and the Written Opinion of the ISA, corresponding to PCT/IB2019/001375, dated Aug. 3, 2020, 11 pages.
European Search Report, EP19154680, dated Jun. 13, 2019, 7 pages.
From the EPO as the ISA, "Notification of Transmittal of the International Search Report and the Written Opinion of the International Searching Authority, or the Declarations", PCT/EP2019/085595, dated Feb. 6, 2020, 12 pages.

* cited by examiner

PHOTORESIST PATTERNING PROCESS SUPPORTING TWO STEP PHOSPHOR-DEPOSITION TO FORM AN LED MATRIX ARRAY

CROSS-REFERENCE TO RELATED APPLICATIONS

This application is a continuation of U.S. application Ser. No. 16/715,930 filed on Dec. 16, 2019, which claims priority to European Patent Application 19156331.1 filed Feb. 11, 2019 and to U.S. Provisional Patent Application 62/783,970 filed Dec. 21, 2018, each of which is incorporated herein by reference in its entirety.

TECHNICAL FIELD

The present disclosure generally relates to a patterning process that allows curing of silicones or siloxanes without substantially harming patterned photoresist release properties. Manufacture of reflective walled phosphor pixel arrays for an LED matrix array is one embodiment enabled using the disclosed patterning process.

BACKGROUND

Low temperature patterning of silicone using conventional positive photoresists can be difficult. The temperatures required to cure silicone are typically higher than temperatures needed to ensure clean removal of photoresist, preventing general usage of photoresist patterned silicone. Processes that allow for low temperature curing of silicone in conjunction with photoresist patterning structures are needed.

This limitation can prevent use of photoresist patterning for semiconductor light-emitting devices (LEDs). LED arrays can be manufactured to include pixels formed from a combination of an LED array with an overlaying array of phosphors embedded in silicone. However, since temperatures required to cure phosphor containing silicone are typically higher than temperatures needed to ensure clean removal of photoresist, improved processes that work for patterning silicones using photoresist structures are needed.

As another example, to improve LED efficiency and operation, light from LED arrays can be arranged to pass from a top of each member of the LED array, through respectively matched phosphor/silicone array, with some percentage being wavelength converted to provide a needed light spectral output. Typically, some proportion of the light is lost by reflection or direct transmission out the side of the phosphor layer. To minimize this loss and crosstalk with neighboring pixels, reflective materials can be used to coat sidewalls of each pixel of the phosphor/silicone array. However, when LEDs are closely positioned next to each other in an array, it is difficult to uniformly coat the sidewalls. Improved processes and structures that allow for forming such reflective coated phosphor/silicone structures using are needed.

SUMMARY

In accordance with embodiments of the invention, a method is described for low temperature curing of silicone structures, including the steps of providing patterned photoresist structures on a substrate. The photoresist structures define at least one open region that can be at least partially filled with a condensation cure silicone system. Vapor phase catalyzation is used to cure the condensation cure silicone system, the photoresist structure is removed to leave free standing or layered silicone structures.

In some embodiments the condensation cure silicone system further includes organosiloxane block copolymers.

In some embodiments vapor phase catalyzation further includes use of superbase catalyzing agents, which can include but are not limited to use of 1,8-Diazabicyclo[5.4.0] undec-7-ene (DBU).

In another embodiment, a method for defining phosphor containing silicone structures suitable for receiving light from LED elements is disclosed. The method includes the steps of providing patterning photoresist structures on a substrate, with the photoresist structures defining at least one open region. The at least one open region is at least partially filled with a phosphor particle containing condensation cure silicone system. The condensation cure silicone system can then be cured after vapor-phase catalyst deposition or concurrently with vapor phase catalyst deposition. The photoresist structure is removed, and silicon bound phosphor particles coated with a reflective material. Cavities defined by the structures of bound phosphor particles can be filled with additional bound phosphor particles, leaving vertical walls of reflective material.

In some embodiments, checkerboard structures can be defined by bound phosphor particles coated with a reflective material. Reflective material can be removed from a top or a bottom of the checkboard structures to leave vertically arranged walls of reflective material positioned only between the checkerboard structures.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
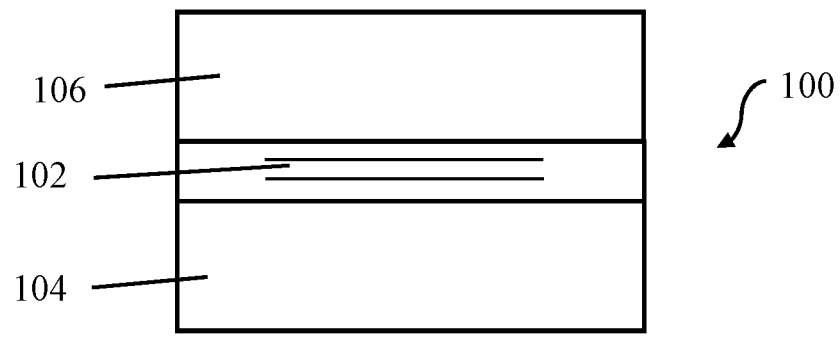
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a phosphor layer 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
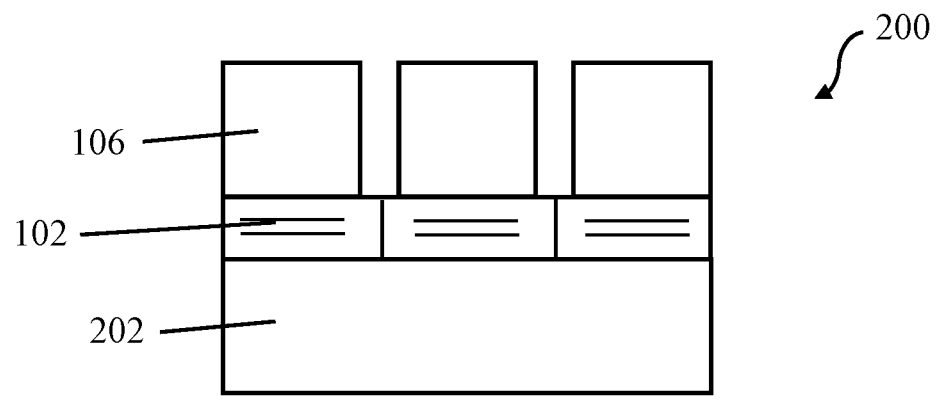
FIGS. 2A and 2B show, respectively, cross-sectional and top schematic views of an array of pcLEDs.
Figure 2B:
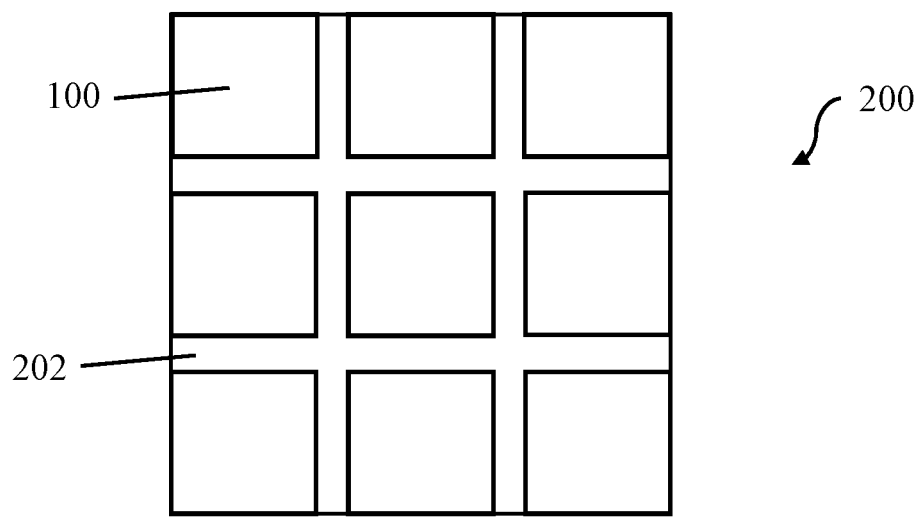

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
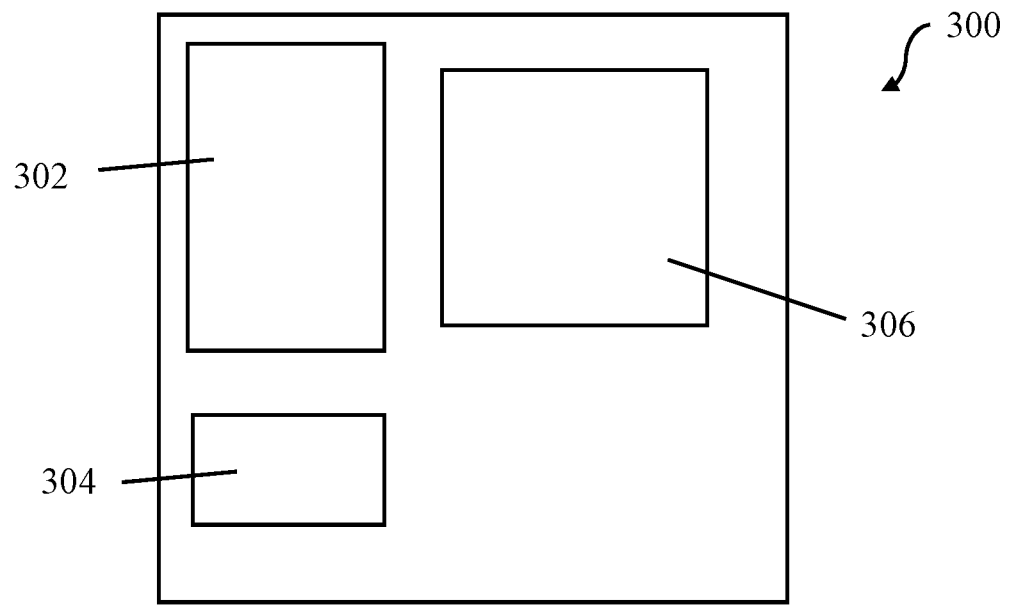
FIG. 3A shows a schematic top view an electronics board on which an array of pcLEDs may be mounted, and FIG. 3B similarly shows an array of pcLEDs mounted on the electronic board of FIG. 3A.
Figure 3B:
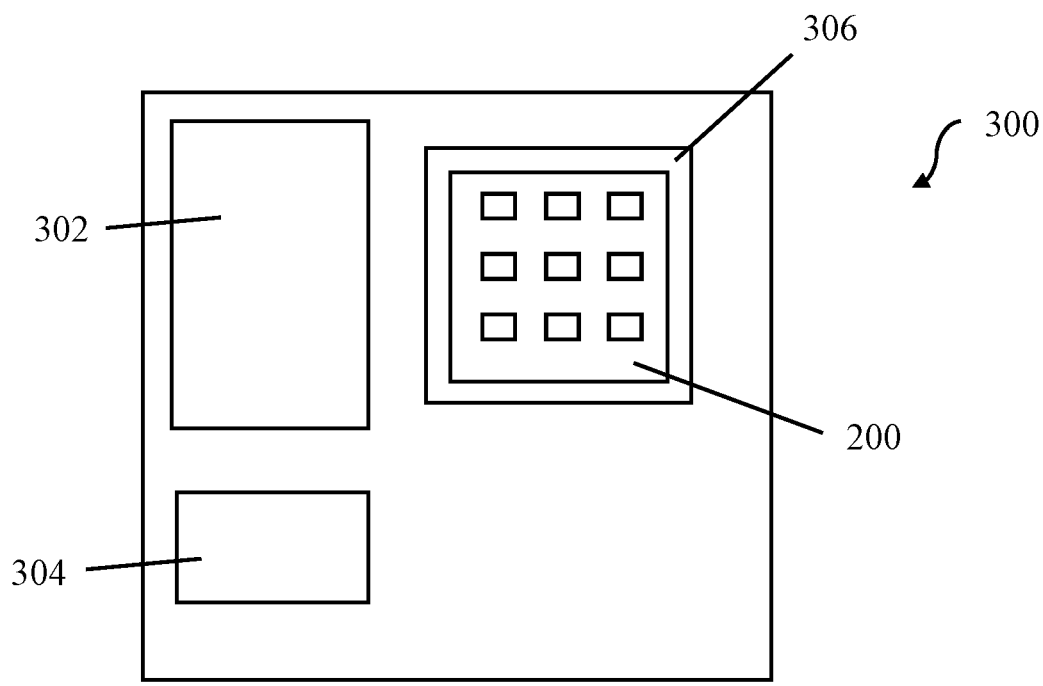

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
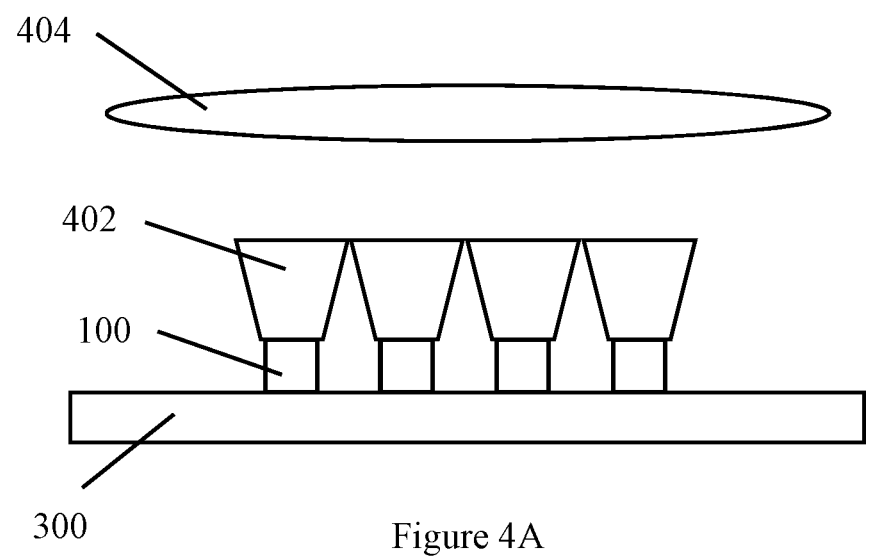
FIG. 4A shows a schematic cross sectional view of an array of pcLEDs arranged with respect to waveguides and a projection lens.
Figure 4B:
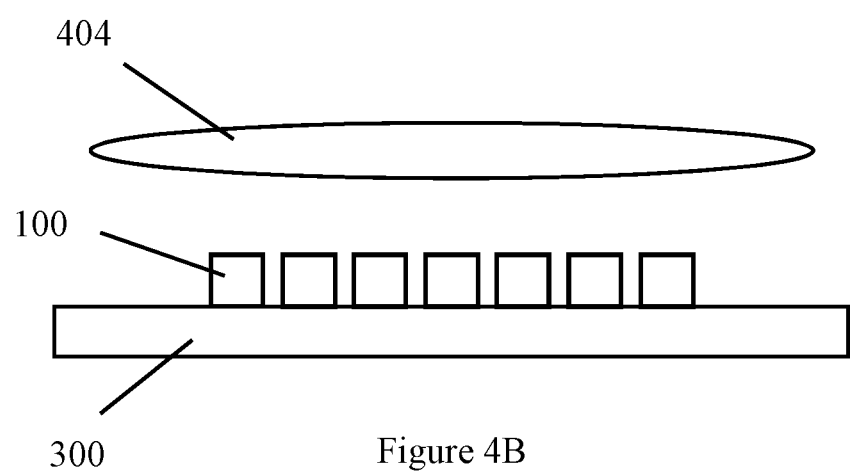
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

For many uses of pcLED arrays, it is desirable to compartmentalize the light emitted from the individual pcLEDs in the array. That is, it is advantageous to be able to operate an individual pcLED in the array as a light source while adjacent pcLEDs in the array remain dark. This allows for better control of displays or of illumination.

It is also advantageous in many applications to place the pcLEDs in the array close together. For example, a preferred configuration in microLEDs is to have minimal spacing between the individual LEDs. Closely spacing the pcLEDs in an array used as a camera flash light source or in an automobile headlight may simplify the requirements on any secondary optics and improve the illumination provided by the array.

However, if pcLEDs in an array are placed close together, optical cross talk between adjacent pcLEDs may occur. That is, light emitted by a pcLED may scatter into or otherwise couple into an adjacent pcLED and appear to originate from that other pcLED, preventing the desired compartmentalization of light.

The possibility of optical crosstalk between pixels in an array prohibits the use of a single shared phosphor layer on top an array of LEDs. Instead, patterned phosphor deposition providing a discrete pixel of phosphor on each light emitting element is needed, in combination with reflecting sidewalls on the phosphor pixels.

If the spacing between the LEDs in the array is small, for instance smaller than 10 or 20 microns, it is difficult to form reflecting side walls on the phosphor pixels with wet chemical or physical deposition methods due to the high aspect ratios of the channels to be filled or coated. The most common scattering layer used as a side coat for LEDs comprises $TiO_2$ scattering particles embedded in silicone. Another option is a reflective metal layer, such as for instance aluminum or silver. Yet another option is a multilayer Distributed Bragg Reflector (DBR) structure formed from a stack of alternating layers of high and low refractive index material, which can provide very high reflectance depending on design. To ensure uniform coating of such reflective layers or structures on the side walls of the phosphor pixels, the side walls should be accessible. If the aspect ratio of the gap between adjacent phosphor pixels is high, inhomogeneities in the reflective coating thickness can be expected leading to non-uniform, non-optimal reflecting properties.

This specification discloses methods that may be used to produce arrays of closely space phosphor pixels having thin side wall reflectors. As summarized above, these methods employ patterned photoresist structures in combination with vapor phase catalyzation of condensation cure silicone systems comprising phosphors.

The temperatures required to cure silicone or siloxanes are typically higher than temperatures needed to ensure clean removal of photoresist, preventing general usage of photoresist patterned silicone. For example, if a photoresist is subjected to a typical silicone cure temperature of 120 degrees Celsius, sufficient cross-linking occurs in the photoresist to prevent wash removal. Alternatively, if a maximum temperature of 90 degrees Celsius is used to ensure later wash removal of the photoresist, the silicone is not adequately cured and partial removal or edge erosion of the silicone structures can occur during the wash step.

Figure 5:
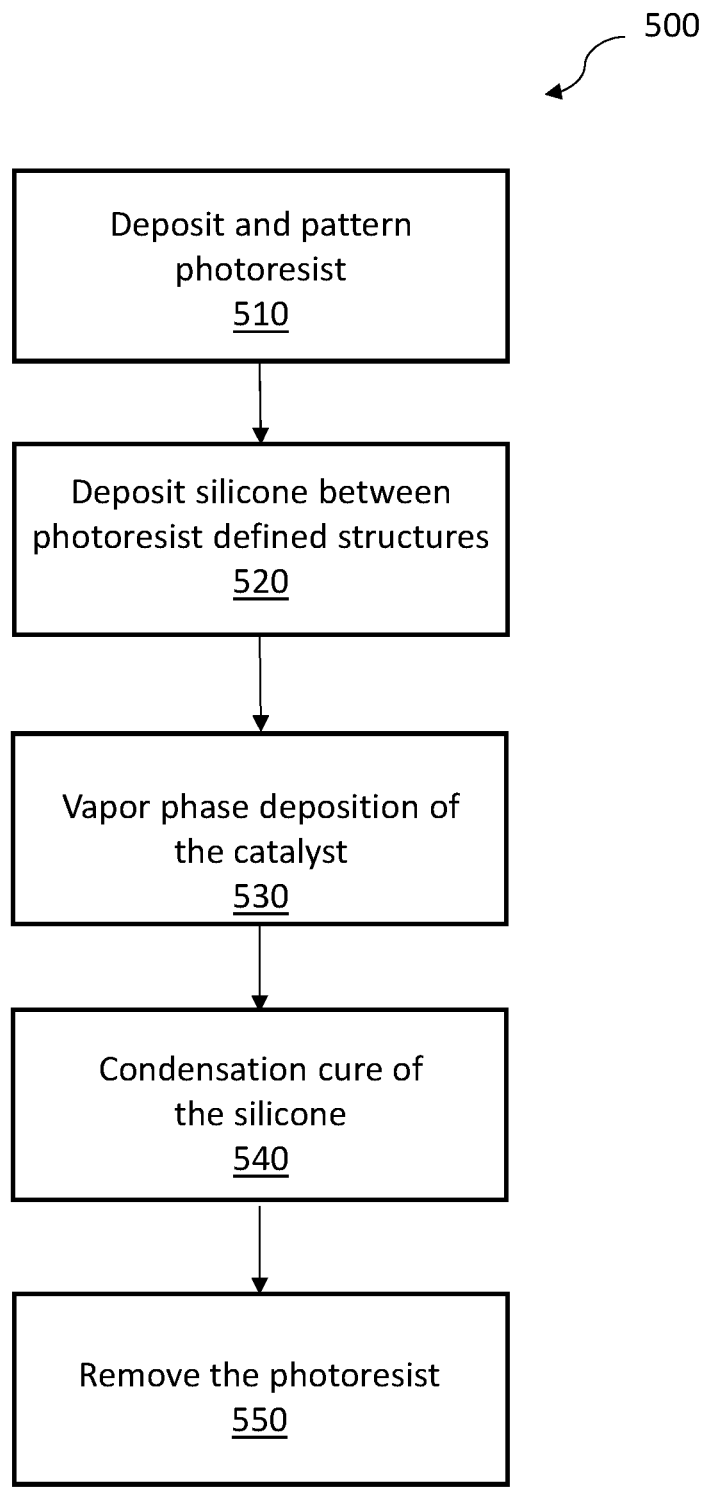
FIG. 5 is a flow chart illustrating an example process for patterning silicones using photoresist structures.

As seen in FIG. 5, a novel low temperature process 500 for patterning of silicone using conventional photoresists is described. Process 500 allows for low temperature curing of silicone in conjunction with photoresist patterning structures and includes a first step 510 of applying a photoresist to a substrate and patterning/removing the photoresist to form desired structures. In a second step 520, cavities or regions defined after photoresist removal are at least partially filled with a condensation cure silicone system. In a third step, a catalyst is added from the vapor phase 530. This is followed by a silicone condensation curing step 540. Then, either concurrently with a silicone condensation curing 540 or after curing, in a fifth step 550 the photoresist is removed.

Positive photoresist compounds useful for this described low temperature process can include photosensitive materials that are degraded by light so that a developer will dissolve away deposited regions that are exposed to light. In effect, this leaves behind a coating where a mask was placed (i.e. the film remains on the formerly dark portions of an illuminated resist). Positive resists typically need to be used at low temperatures, since they are susceptible to permanent crosslinking (also called "hard bake") at high temperatures, rendering the resist unable to be removed afterwards by the stripping bath (typically a mild solvent system).

The condensation cure silicone system can include curable polysiloxane compositions that can provide acceptable cure rates without significant processing and storage difficulties In certain embodiments, the condensation cure silicone system can include optional organic, inorganic, or organic/inorganic binder and filler material. In one embodiment, light active phosphors, dyes, or nanoparticles can be bound together by the silicone. In other embodiments, the silicone can form optical structures, including lenses, light guides, or refractive elements.

Catalysts for the condensation cure silicone system catalysts can be selected to minimize generation of species requiring removal, and/or should not require high-temperature activation to enable curing at relatively low temperatures and/or the use of heat-sensitive substrates. Compositions can employ catalysts that are relatively non-toxic, and that are relatively stable in solution but relatively fast-curing upon drying. Catalysts can be effective in relatively low concentrations, and/or effective under relatively low (or no) moisture conditions. Catalysts that can be employed as a vapor phase can be used. In one embodiment, vapor phase cure of the condensation cure silicone system can be conducted using basic or alkaline catalyzing agents. In an embodiment, superbase catalyzing agents such as described in U.S. Pat. No. 9,688,035 by Swier et. al. can be used. In some embodiments, silicone solid compositions manufactured using a superbase catalyst exhibit enhanced cure rates, improved mechanical strength, and improved thermal stability over similar compositions without the superbase catalyst.

The term "superbase" used herein refers to compounds having a very high basicity, such as lithium diisopropylamide. The term "superbase" also encompasses bases resulting from a mixing of two (or more) bases leading to new basic species possessing inherent new properties. The term "superbase" does not necessarily mean a base that is thermodynamically and/or kinetically stronger than another. Instead, in some embodiments, it means that a basic reagent is created by combining the characteristics of several different bases. The term "superbase" also encompasses any species with a higher absolute proton affinity (APA=245.3 kcal/mole) and intrinsic gas phase basicity (GB=239 kcal/mole) relative to 1,8-bis-(dimethylamino)-naphthalene.

Non-limiting examples of superbases include organic superbases, organometallic superbases, and inorganic superbases. Organic superbases include but are not limited to nitrogen-containing compounds. In some embodiments, the nitrogen-containing compounds also have low nucleophilicity and relatively mild conditions of use. Non-limiting examples of nitrogen-containing compounds include phosphazenes, amidines, guanidines, and multicyclic polyamines. Organic superbases also include compounds where a reactive metal has been exchanged for a hydrogen on a heteroatom, such as oxygen (unstabilized alkoxides) or nitrogen (metal amides such as lithium diisopropylamide). In some embodiments, the superbase catalyst is an amidine compound. In some embodiments, the term "superbase" refers to organic superbases having at least two nitrogen atoms and a pKb of from about 0.5 to about 11, as measured in water.

In certain embodiments of the present invention, the superbase catalyst is an organic superbase, such as any of the organic superbases as described above or known in the art.

In a further embodiment, the superbase catalyst comprises:

1,8-Diazabicyclo[5.4.0]undec-7-ene (DBU), (CAS #6674-22-2)

The amount of the superbase catalyst can vary and is not limiting. Typically, the amount added through vapor phase is a catalytically effective amount, which may vary depending on the superbase selected, and vapor permeation properties of the siloxane polymer resin. The amount of superbase catalyst is typically measured in parts per million (ppm) in the solid composition. In particular, the catalyst level is calculated in regard to copolymer solids. The amount of superbase catalyst added to the curable compositions may range from 0.1 to 1,000 ppm, alternatively from 1 to 500 ppm, or alternatively from 10 to 100 ppm, as based on the polymer resin content (by weight) present in the solid compositions.

Silicone material or siloxanes can be selected for mechanical stability, low temperature cure properties (e.g. below 150-120 degrees Celsius), and ability to be catalyzed using vapor phase catalysts. In one embodiment, organosiloxane block copolymers can be used. Organopolysiloxanes containing D and T units, where the D unit are primarily bonded together to form linear blocks having 10 to 400 D units and the T units are primarily bonded to each other to form branched polymeric chains, which are referred to as "non-linear blocks" can be used.

Patterned vapor phase catalyzed silicone or siloxane materials such as previously described can be used in LED and microLED packaging. LED packages can contain phosphor material bound together using vapor phase catalyzed silicone. In some embodiments, silicone bound phosphor material can form sidewalls that can be coated with metals, light reflective materials, or mirrors (e.g. a distributed Bragg reflector—"DBR mirror").

The phosphors bound together using vapor phase catalyzed silicone can be positioned on a substrate formed of sapphire or silicon carbide that is able to support an epitaxially grown or deposited semiconductor n-layer. A semiconductor p-layer can be sequentially grown or deposited on the n-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials.

Phosphors can include one or more wavelength converting materials able to create white light or monochromatic light of other colors. All or only a portion of the light emitted by the LED may be converted by the wavelength converting material of the phosphor. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors. Phosphors bound together with silicone can be molded, dispensed, screen printed, sprayed, or laminated.

In one embodiment, the light reflection material can be a metallized layer. In other embodiments, a dielectric mirror or DBR can be used. In some embodiments, light reflection material can include a thin layer of a binder such as silicone and light reflective particles. Light reflective material can also include organic, inorganic, or organic/inorganic binder and filler material. For example, organic/inorganic binder and filler can be, for example, silicone with embedded reflective titanium oxide ($TiO_2$), $SiO_2$, or other reflective/scattering particles. Inorganic binders can include sol-gel (e.g., a sol-gel of TEOS or MTMS) or liquid glass (e.g., sodium silicate or potassium silicate), also known as water glass. In some embodiments, binders can include fillers that adjust physical properties. Fillers can include inorganic nanoparticles, silica, glass particles or fibers, or other materials able to improve optical or thermal performance. The light reflective material can be applied to the sidewalls by various processes, including evaporative deposition (for metals) atomic layer deposition (for DBR mirrors), or molding, dispensing, screen printing, spray, or lamination (for reflective particles in a binder).

In still other embodiments primary or secondary optics can be attached or positioned near the silicone bound phosphors in LED package. Optics can include concave or convex lenses, lenslet arrays, graded index lens, reflectors, scattering elements, beam homogenizers, diffusers, or other light focusing or blurring optics. Protective layers, transparent layers, thermal layers, or other packaging structures can be used as needed for specific applications.

Figure 6A:
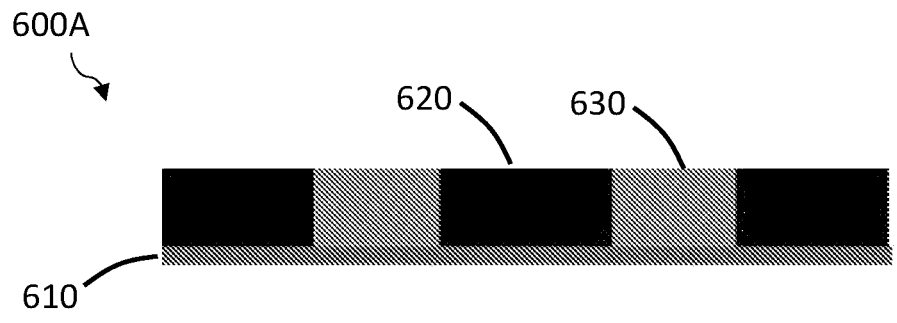
FIGS. 6A, 6B, 6C, 6D, 6E, 6F, and 6G illustrate steps in an example method of manufacturing silicone and phosphor structures for LED packages.

As seen in FIGS. 6A-6G, a process is described for forming a patterned phosphor structure using positive photoresist and vapor phase catalyzed silicone containing particulate phosphors. As seen in FIG. 6A, a structure 600A includes a substrate 610 supporting a removable positive photoresist 620 and a silicone structure 630 containing optional phosphors, dyes, light activated nanoparticles, fillers, or other materials.

Figure 6B:
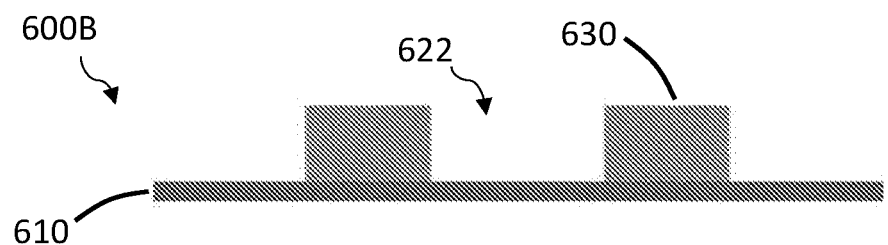

FIG. 6B illustrates structure 600B defined after removal of the positive photoresist, leaving freestanding silicone 630 pillars or forms, with cavities 622 defined adjacent to the silicone structures 630. The cavities can include but are not limited to holes, channels, regular patterns such a rectangular layouts, checkerboard layouts, curved or serpentine layouts, or hexagonal layouts.

Figure 6C:
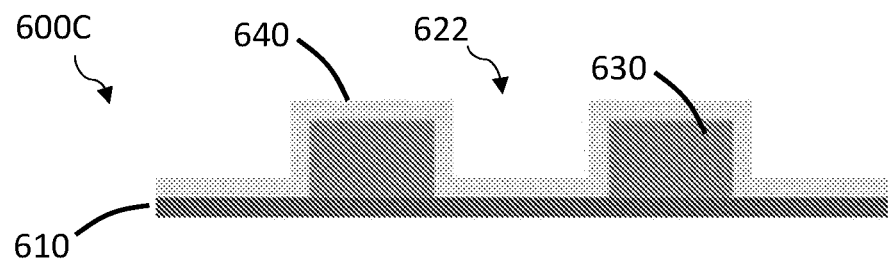

FIG. 6C illustrates a structure 600C after application of a reflective layer 640 over the silicone structure top, sidewalls, and substrate 610. The reflective layer can be a metal, a dielectric mirror, or reflective particles contained in a binder.

Figure 6D:
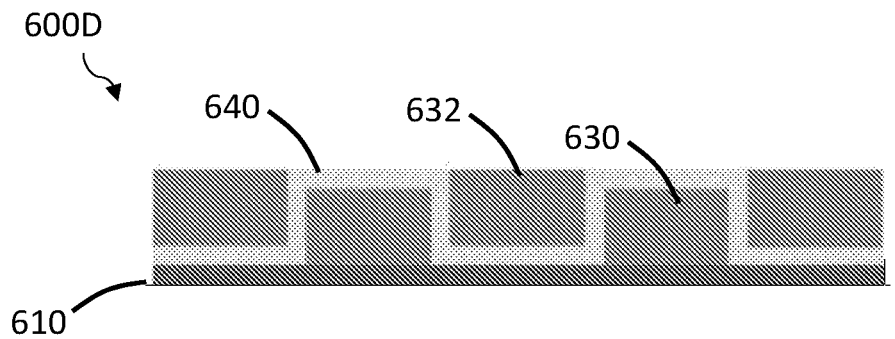

FIG. 6D illustrates a structure 620D after infill of cavities 622 with silicone and optional phosphors, dyes, light activated nanoparticles, fillers, or other materials. The silicone can be identical to that used in FIG. 6A-6C, or other types of silicone systems and phosphors can be used. For example, a high temperature silicone system that does not require vapor catalyzation can be used with a set of phosphors having different emission properties.

Figure 6E:
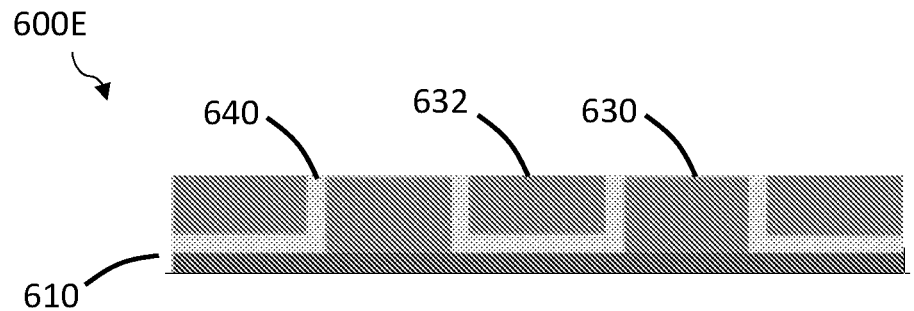

FIG. 6E illustrates a structure 600E after removal of the top reflective layer by grinding, polishing, or etching.

Figure 6F:
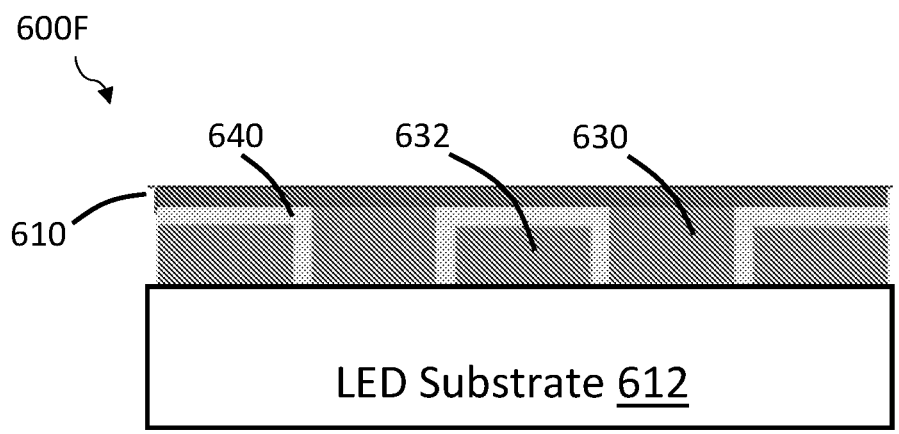

FIG. 6F illustrates a structure 600F after flipping and attachment to an LED substrate that includes active light emitters. The LED substrate can be a microLED with micron scale features and/or millimeter scale pixels.

Figure 6G:
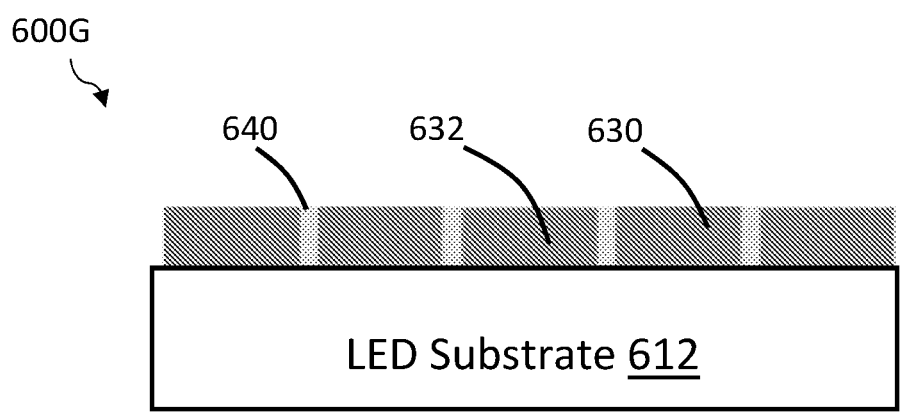

FIG. 6G illustrates a structure 600G after removal of the substrate 610 and top reflective layer by conventional release techniques and/or grinding, polishing, or etching. This leaves vertical reflective coatings 640 on the sidewalls between silicone structures 630, providing optical isolation between phosphor pixel structures.

Figure 7:
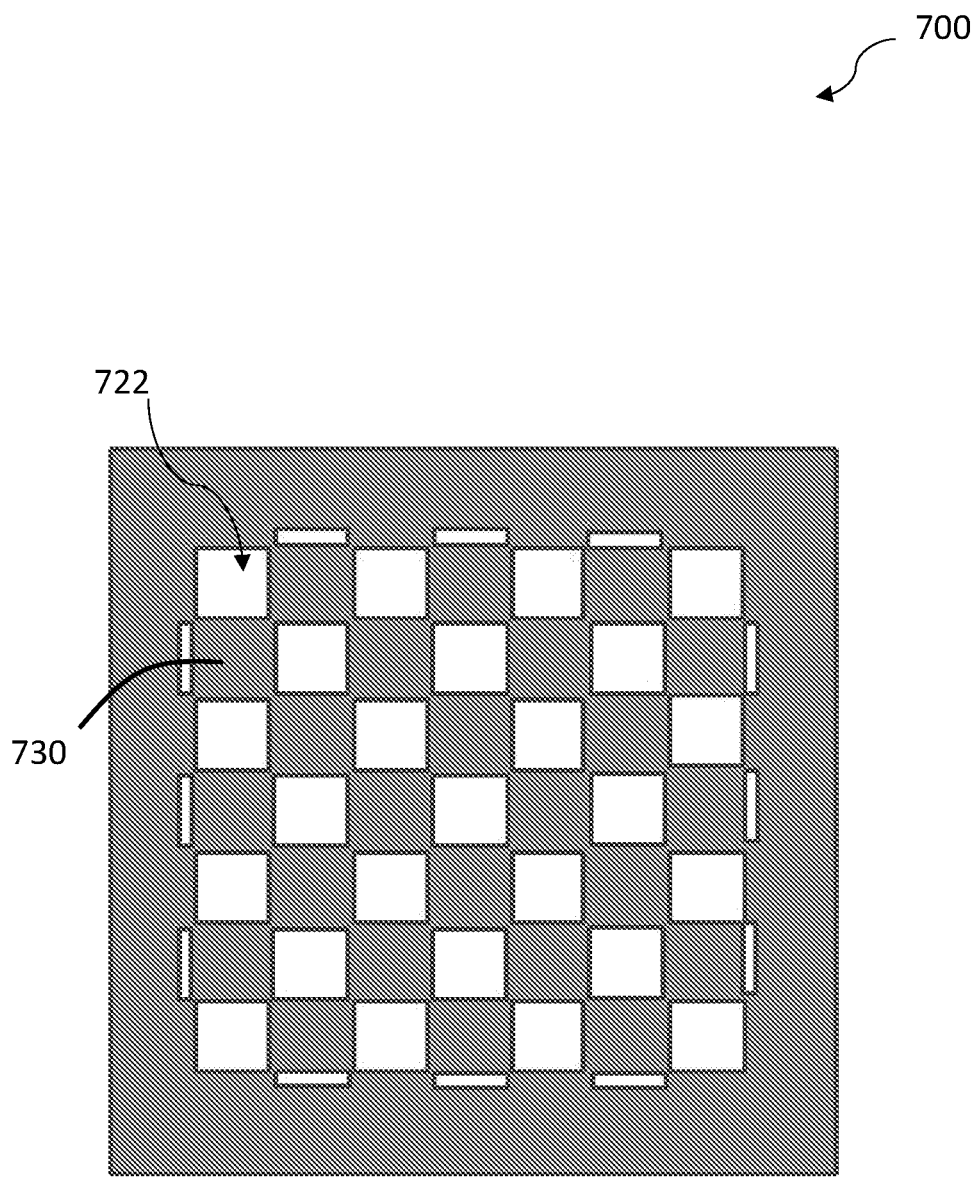
FIG. 7 illustrates an intermediate checkerboard structure prior to infill with silicone and phosphor material.

FIG. 7 illustrates an intermediate structure 700 corresponding to the processing step illustrated by FIG. 6C. The includes a checkerboard pattern with one half of the phosphor array being formed and cured, and reflective layer formed to cover vapor catalyzed silicone containing particulate phosphor "islands" 730. The cavities channels or grooves (gaps) 722 between the islands 730 will be infilled with additional phosphor in a next step, cured, and any applied reflective material on a top and bottom surface removed prior to attachment of both the phosphor structure to an LED array and any additional optics.

Light emitting arrays or microLED arrays such as disclosed herein may support a wide range of applications that benefit from fine-grained intensity, spatial, and temporal control of light distribution. This may include, but is not limited to, precise spatial patterning of emitted light from blocks or individual LEDs. Depending on the application, emitted light may be spectrally distinct, adaptive over time, and/or environmentally responsive. In some embodiments, the light emitting arrays may provide pre-programmed light distribution in various intensity, spatial, or temporal patterns. The emitted light may be based at least in part on received sensor data and may be used for optical wireless communications. As noted above, associated optics may be distinct at single or multiple LED level. An example light emitting array may include a device having a commonly controlled central block of high intensity LEDS with an associated common optic, whereas edge positioned LEDs may have individual optics. Common applications supported by light emitting LED arrays include video lighting, automotive headlights, architectural and area illumination, street lighting, and informational displays.

Programmable light emitting arrays may be used to selectively and adaptively illuminate buildings or areas for improved visual display or to reduce lighting costs. In addition, light emitting arrays may be used to project media facades for decorative motion or video effects. In conjunction with tracking sensors and/or cameras, selective illumination of areas around pedestrians may be possible. Spectrally distinct LEDs may be used to adjust the color temperature of lighting, as well as support wavelength specific horticultural illumination.

Street lighting is an important application that may greatly benefit from use of programmable light emitting arrays. A single type of light emitting array may be used to mimic various street light types, allowing, for example, switching between a Type I linear street light and a Type IV semicircular street light by appropriate activation or deactivation of selected LEDs. In addition, street lighting costs may be lowered by adjusting light beam intensity or distribution according to environmental conditions or time of use. For example, light intensity and area of distribution may be reduced when pedestrians are not present. If LEDs of the light emitting array are spectrally distinct, the color temperature of the light may be adjusted according to respective daylight, twilight, or night conditions.

Programmable light emitting LEDs are also well suited for supporting applications requiring direct or projected displays. For example, automotive headlights requiring calibration, or warning, emergency, or informational signs may all be displayed or projected using light emitting arrays. This allows, for example, modifying directionality of light output from a automotive headlight. If a light emitting array is composed of a large number of LEDs or includes a suitable dynamic light mask, textual or numerical information may be presented with user guided placement. Directional arrows or similar indicators may also be provided.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A phosphor structure comprising:
    a plurality of phosphor pixels spaced apart from each other, each of the phosphor pixels comprising side walls facing adjacent phosphor pixels, and a top surface and a bottom surface having at least one of the side walls in between them; and
    a reflective structure disposed between the side walls of adjacent phosphor pixels, and disposed at alternating top surfaces and bottom surfaces of adjacent phosphor pixels.

2. The phosphor structure of claim 1, wherein each of the phosphor pixels comprises phosphors in a silicone or siloxane.

3. The phosphor structure of claim 1, wherein the reflective structure comprises a distributed Bragg reflector.

4. The phosphor structure of claim 1, wherein the reflective structure comprises a binder and light reflective particles.

5. The phosphor structure of claim 4, wherein the binder is an inorganic binder.

6. The phosphor structure of claim 4, wherein the binder is an organic binder.

7. The phosphor structure of claim 1, wherein the reflective structure comprises wall portions extending in a vertical direction disposed between the side walls of adjacent phosphor pixels and surface portions extending in a horizontal direction perpendicular to the vertical direction disposed at the alternating top surfaces and bottom surfaces of adjacent phosphor pixels, and adjacent surface portions disposed at respective top and bottom surfaces are connected to each other through respective ones of the wall portions between adjacent surface portions.

8. The phosphor structure of claim 1, wherein adjacent phosphor pixels comprise a pair of top surfaces that are not flush with each other, and adjacent phosphor pixels comprise a pair of bottom surfaces that are not flush with each other.

9. The phosphor structure of claim 1, wherein a spacing between adjacent phosphor pixels is equal to the thickness of the reflective structure disposed between them, which is less than or equal to about 3 microns.

10. The phosphor structure of claim 1, wherein the phosphor pixels comprise dyes.

11. The phosphor structure of claim 1, wherein the phosphor pixels comprise lenses.

12. The phosphor structure of claim 1, wherein at least some of the phosphor pixels have different emission properties from each other.

13. The phosphor structure of claim 1, wherein the phosphor pixels comprise silicone.

14. The phosphor structure of claim 1, further comprising a substrate in direct contact with the reflective structure.

15. The phosphor structure of claim 1, wherein the substrate is in direct contact with at least some of the phosphor pixels.

* * * * *